(12) United States Patent
Tamaki

(10) Patent No.: US 11,957,056 B2
(45) Date of Patent: Apr. 9, 2024

(54) THERMOELECTRIC CONVERSION UNIT

(71) Applicant: Panasonic Intellectual Property Management Co., Ltd., Osaka (JP)

(72) Inventor: Hiromasa Tamaki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/057,759

(22) Filed: Nov. 21, 2022

(65) Prior Publication Data

US 2023/0081621 A1 Mar. 16, 2023

Related U.S. Application Data

(63) Continuation of application No. PCT/JP2021/019289, filed on May 21, 2021.

(30) Foreign Application Priority Data

Jun. 15, 2020 (JP) .................................. 2020-103103

(51) Int. Cl.
  *H10N 10/17* (2023.01)
  *H01L 25/04* (2023.01)
  *H10N 10/13* (2023.01)

(52) U.S. Cl.
  CPC ............. *H10N 10/17* (2023.02); *H01L 25/04* (2013.01); *H10N 10/13* (2023.02)

(58) Field of Classification Search
  CPC ......... H10N 10/17; H10N 10/13; H01L 25/04
  See application file for complete search history.

(56) References Cited

U.S. PATENT DOCUMENTS

2013/0340801 A1* 12/2013 Zhang .................... H10N 10/13
                                                                    136/212

FOREIGN PATENT DOCUMENTS

CN        103261613 A  *  8/2013  ............. F01N 1/083

OTHER PUBLICATIONS

Gauss et al., "CN 103261613 A", English Machine Translation. (Year: 2013).*
International Search Report of PCT application No. PCT/JP2021/019289 dated Jun. 29, 2021.

* cited by examiner

*Primary Examiner* — Tae-Sik Kang
(74) *Attorney, Agent, or Firm* — Wenderoth, Lind & Ponack, L.L.P.

(57) ABSTRACT

A thermoelectric conversion unit includes a pair of low-temperature fluid flow path sections arranged to face each other, a high-temperature fluid flow path section arranged between the pair of low-temperature fluid flow path sections, a pair of thermoelectric modules each arranged between the high-temperature fluid flow path section and one of the pair of low-temperature fluid flow path sections in a one-to-one relation, and a rod-shaped convex fin and concave fin both arranged in the high-temperature fluid flow path section. The concave fin includes a recess fitted to the convex fin. An outer peripheral surface of the convex fin and an inner peripheral surface of the recess of the concave fin are in contact with each other, and a gap is formed between a tip of the convex fin and a bottom of the recess of the concave fin.

12 Claims, 5 Drawing Sheets

THERMOELECTRIC CONVERSION UNIT

BACKGROUND

1. Technical Field

The present disclosure relates to a thermoelectric conversion unit converting thermal energy to electrical energy.

2. Description of the Related Art

There is known a thermoelectric conversion unit converting thermal energy to electrical energy (see, for example, U.S. Patent Application Publication No. 2013/0340801). The related-art thermoelectric conversion unit includes a pair of low-temperature fluid flow path section arranged to face each other, a high-temperature fluid flow path section arranged between the pair of low-temperature fluid flow path sections, and a pair of thermoelectric modules each disposed between the high-temperature fluid flow path section and one of the pair of low-temperature fluid flow path sections in a one-to-one relation. The thermoelectric modules each convert thermal energy, given as a temperature difference between the high-temperature fluid flowing through the high-temperature fluid flow path section and the low-temperature fluid flowing through the low-temperature fluid flow path section, to electrical energy by utilizing the Seebeck effect.

The above-described related-art thermoelectric conversion unit further includes pin fins that are disposed in the high-temperature fluid flow path section. Both ends of each of the pin fins are fixed to the pair of thermoelectric modules in a one-to-one relation. Heat of the high-temperature fluid flowing through the high-temperature fluid flow path section is transferred to each of the pair of thermoelectric modules through the pin fins.

SUMMARY

In the related-art thermoelectric conversion unit described above, when temperature of the high-temperature fluid flowing through the high-temperature fluid flow path section changes, the pin fin thermally expands or contracts. This applies stress to the fixed positions between the ends of the pin fin and the thermoelectric modules and causes a possibility that the thermoelectric module may be deformed.

One non-limiting and exemplary embodiment provides a thermoelectric conversion unit capable of suppressing deformation of a thermoelectric module caused by change in temperature of a second fluid (high-temperature fluid).

In one general aspect, the techniques disclosed here feature a thermoelectric conversion unit generating electricity based on a temperature difference between a first fluid and a second fluid at higher temperature than the first fluid, the thermoelectric conversion unit including a pair of first fluid flow path sections through each of which the first fluid flows, the first fluid flow path sections being arranged to face each other, a second fluid flow path section through which the second fluid flows, the second fluid flow path section being arranged between the pair of first fluid flow path sections, a pair of thermoelectric modules each arranged between the second fluid flow path section and one of the pair of first fluid flow path sections in a one-to-one relation, the thermoelectric modules converting thermal energy given by the temperature difference between the first fluid and the second fluid to electrical energy, a convex fin formed in a rod shape and arranged in the second fluid flow path section, the convex fin being connected to one of the pair of thermoelectric modules in a heat-transferable manner and projecting toward the other of the pair of thermoelectric modules, and a concave fin formed in a rod shape and arranged in the second fluid flow path section, the concave fin being connected to the other of the pair of thermoelectric modules in a heat-transferable manner and projecting toward the one of the pair of thermoelectric modules, wherein the concave fin includes a recess fitted to the convex fin, and wherein an outer peripheral surface of the convex fin and an inner peripheral surface of the recess of the concave fin are in contact with each other, and a gap is formed between a tip of the convex fin and a bottom of the recess of the concave fin.

With the thermoelectric conversion unit according to the one general aspect of the present disclosure, deformation of the thermoelectric module caused by change in temperature of the second fluid can be suppressed.

It should be noted that the above-described generic or specific embodiment may be implemented in the form of a device or a method or may be implemented in a selective combination of a device and a method.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

A thermoelectric conversion unit according to one aspect of the present disclosure generates electricity based on a temperature difference between a first fluid and a second fluid at higher temperature than the first fluid, the thermoelectric conversion unit including a pair of first fluid flow path sections through each of which the first fluid flows, the first fluid flow path sections being arranged to face each other, a second fluid flow path section through which the second fluid flows, the second fluid flow path section being arranged between the pair of first fluid flow path sections, a pair of thermoelectric modules each arranged between the second fluid flow path section and one of the pair of first fluid flow path sections in a one-to-one relation, the thermoelectric modules converting thermal energy given by the temperature difference between the first fluid and the second fluid to electrical energy, a convex fin formed in a rod shape and arranged in the second fluid flow path section, the convex fin being connected to one of the pair of thermoelectric modules in a heat-transferable manner and projecting toward the other of the pair of thermoelectric modules, and a concave fin formed in a rod shape and arranged in the second fluid flow path section, the concave fin being connected to the other of the pair of thermoelectric modules in a heat-transferable manner and projecting toward the one of the pair of thermoelectric modules, wherein the concave fin includes a recess fitted to the convex fin, and wherein an outer peripheral surface of the convex fin and an inner peripheral surface of the recess of the concave fin are in contact with each other, and a gap is formed between a tip of the convex fin and a bottom of the recess of the concave fin.

With the feature described above, the convex fin is fitted to the recess of the concave fin. Therefore, even when the convex fin and the concave fin fitted to each other are thermally expanded or contracted due to change in temperature of the second fluid flowing through the second fluid flow path section, the outer peripheral surface of the convex fin and the inner peripheral surface of the recess of the concave fin are allowed to slide relatively in an axial direction. On that occasion, the thermal expansion or contraction of the convex fin and the concave fin in the axial direction is absorbed by the gap formed between the tip of the convex fin and the bottom of the recess of the concave fin. As a result, it is possible to absorb stress applied to each of the pair of thermoelectric modules and to suppress deformations of the pair of thermoelectric modules, the deformations being caused by change in temperature of the second fluid.

A width of the gap may be greater than or equal to 0.1% and smaller than or equal to 10% of an entire length of the convex fin and the concave fin in a mutually fitted state.

With the feature described above, the thermal expansion or contraction of the convex fin and the concave fin in the axial direction is sufficiently absorbed, and a contact area between the outer peripheral surface of the convex fin and the inner peripheral surface of the recess of the concave fin can be sufficiently ensured.

The outer peripheral surface of the convex fin and the inner peripheral surface of the recess of the concave fin may be each formed in a tapered shape.

With the feature described above, the stress generated upon the thermal expansion or contraction can be released in a radial direction of the convex fin and the concave fin. Since weak brace stress remains in the axial direction of the convex fin and the concave fin, interface heat resistance can be kept low while contact between the pair of thermoelectric modules and each of the convex fin and the concave fins can be maintained. Thus, the heat transfer performance between the second fluid and each of the pair of thermoelectric modules can be ensured.

The concave fin may include a cutout extending along an axial direction of the concave fin.

With the feature described above, since the cutout is formed in the concave fin, the concave fin is deformable in the radial direction. Accordingly, the thermal expansion or contraction of the convex fin and the concave fin in the radial direction can be absorbed.

A heat transfer material giving a sliding ability to between the convex fin and the concave fin and transferring heat between the convex fin and the concave fin may be interposed between the outer peripheral surface of the convex fin and the inner peripheral surface of the recess of the concave fin.

With the feature described above, when the convex fin and the concave fin fitted to each other are thermally expanded or contracted, the outer peripheral surface of the convex fin and the inner peripheral surface of the recess of the concave fin are allowed to smoothly slide relatively in the axial direction.

The thermoelectric conversion unit may further include a biasing member arranged in the gap and biasing the convex fin and the concave fin respectively toward the one and the other of the pair of thermoelectric modules.

With the feature described above, the biasing member enables the convex fin and the concave fin to be reliably connected to respectively the one and the other of the pair of thermoelectric modules in a heat-transferable manner.

An interior and a surface of each of the convex fin and the concave fin may be made of different materials.

The interior of each of the convex fin and the concave fin may be made of copper, a copper alloy, aluminum, an aluminum alloy, stainless, or ceramic.

With the feature described above, the interior of each of the convex fin and the concave fin can be made of a material with high thermal conductivity.

The surface of each of the convex fin and the concave fin may be made of nickel, a nickel alloy, chromium, or a chromium alloy.

With the feature described above, the surface of each of the convex fin and the concave fin can be coated with a material with high corrosion resistance. As a result, the interior of each of the convex fin and the concave fin can be suppressed from being oxidized and corroded in the atmosphere at high temperature.

Those generic or specific embodiments may be implemented in the form of a device or a method or may be implemented in a selective combination of a device and a method.

The embodiments will be described below with reference to the drawings.

It is to be noted that the following embodiments represent generic or specific examples. Numerical values, shapes, materials, constituent elements, layout positions and connection forms of the constituent elements, steps, order of the steps, etc., which are described in the following embodiments, are merely illustrative, and they are not purported to limit the scope of Claims. Ones of the constituent elements in the following embodiments, those ones being not stated in independent claims representing the most significant concept, are explained as optional constituent elements. The drawings are not always exactly drawn in a strict sense. In the drawings, substantially the same constituent elements are denoted by the same reference sings, and duplicate description of those constituent elements is omitted or simplified in some cases.

Embodiment 1

1-1. Overall Structure of Thermoelectric Conversion Unit

Figure 1:
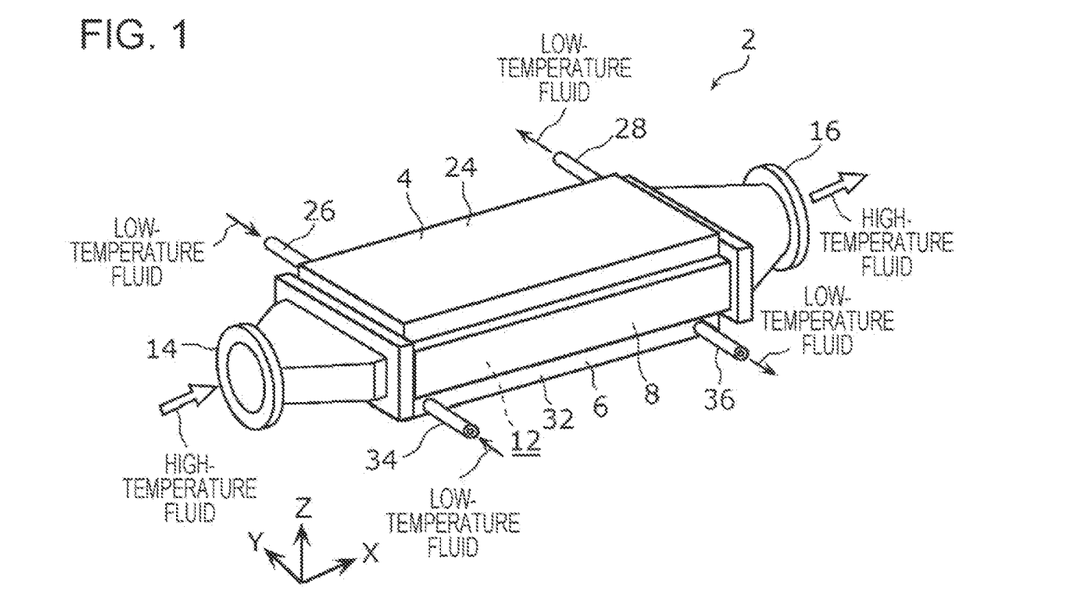
FIG. 1 is a perspective view of a thermoelectric conversion unit according to Embodiment 1.

First, an overall structure of a thermoelectric conversion unit 2 according to Embodiment 1 will be described below with reference to FIGS. 1 to 3. FIG. 1 is a perspective view of the thermoelectric conversion unit 2 according to Embodiment 1. FIG. is an exploded perspective view of the thermoelectric conversion unit 2 according to Embodiment 1. FIG. 3 is a sectional view, taken along a line III-III in FIG.

2, of principal part of the thermoelectric conversion unit 2 according to Embodiment 1. In FIGS. 1 to 3, a front-rear direction of the thermoelectric conversion unit 2 is referred to as an X-axis direction, a left-right direction of the thermoelectric conversion unit 2 is referred to as a Y-axis direction, and an up-down direction of the thermoelectric conversion unit 2 is referred to as a Z-axis direction.

The thermoelectric conversion unit 2 is a thermoelectric conversion unit for generating electricity by utilizing thermal energy of, for example, exhaust gas discharged from an on-vehicle engine.

Figure 2:
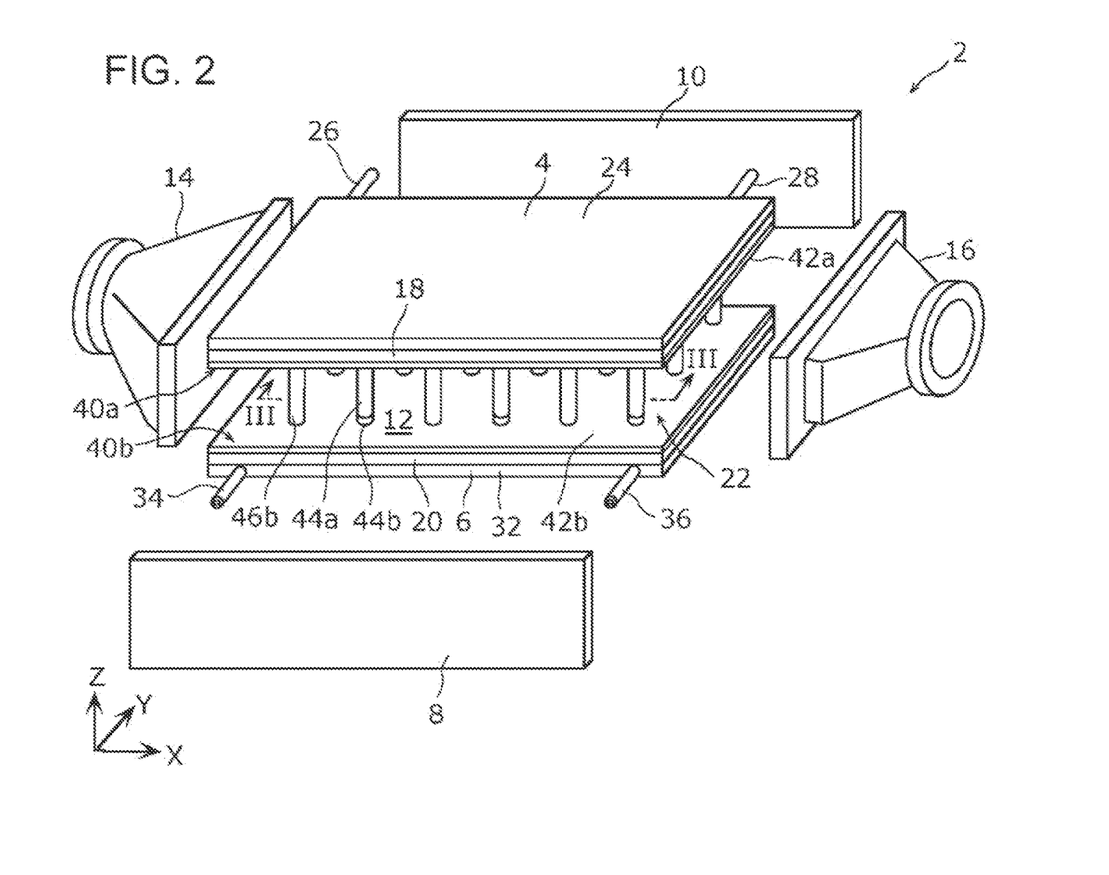
FIG. 2 is an exploded perspective view of the thermoelectric conversion unit according to Embodiment 1.
Figure 3:
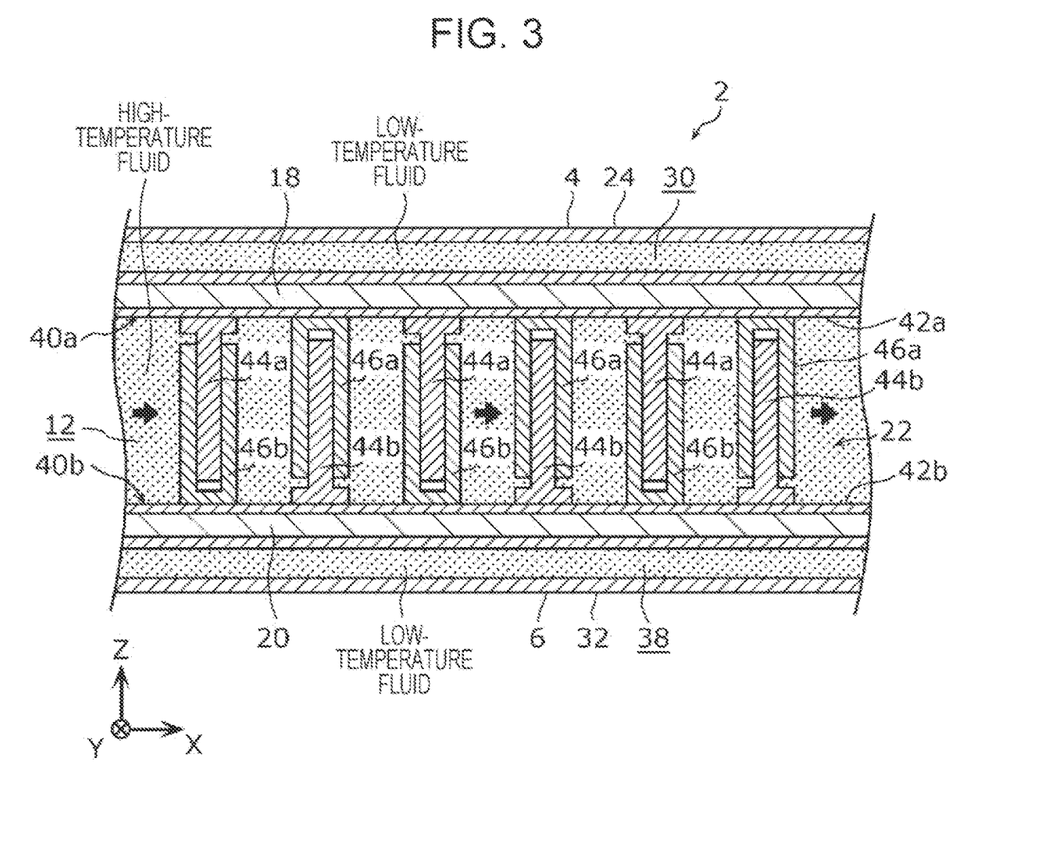
FIG. 3 is a sectional view, taken along a line III-III in FIG. 2, of principal part of the thermoelectric conversion unit according to Embodiment 1.

As illustrated in FIGS. 1 to 3, the thermoelectric conversion unit 2 includes a pair of low-temperature fluid flow path sections 4 and 6 (an example of a pair of first fluid flow path sections), a pair of side restriction member 8 and 10, a high-temperature fluid flow path section 12 (an example of a second fluid flow path section), a high-temperature fluid introduction member 14, a high-temperature fluid discharge member 16, a pair of thermoelectric modules 18 and 20, and a fin structure 22.

As illustrated in FIGS. 2 and 3, the pair of low-temperature fluid flow path sections and 6 are arranged to face each other with a spacing therebetween in the up-down direction (Z-axis direction).

The low-temperature fluid flow path section 4 on an upper side is composed of a flat and hollow rectangular parallelepiped housing 24, a tubular low-temperature fluid introduction member 26, and a tubular low-temperature fluid discharge member 28, those members 26 and 28 projecting to the outside from a side surface of the housing 24. As illustrated in FIG. 3, a low-temperature fluid flow path 30 through which a low-temperature fluid (an example of a first fluid) flows is formed inside the housing 24. The low-temperature fluid is, for example, cold water or cold air at lower temperature than a high-temperature fluid (described later). The low-temperature fluid introduction member 26 and the low-temperature fluid discharge member 28 are arranged with a spacing therebetween in the front-rear direction (X-axis direction) and are in communication with the low-temperature fluid flow path 30 inside the housing 24. The low-temperature fluid flows into the low-temperature fluid flow path 30 inside the housing 24 through the low-temperature fluid introduction member 26 and is discharged to the outside through the low-temperature fluid discharge member 28 after flowing through the low-temperature fluid flow path 30.

The low-temperature fluid flow path section 6 on a lower side includes a flat and hollow rectangular parallelepiped housing 32, a tubular low-temperature fluid introduction member 34, and a tubular low-temperature fluid discharge member 36, those members 34 and 36 projecting to the outside from a side surface of the housing 32. As illustrated in FIG. 3, a low-temperature fluid flow path 38 through which the low-temperature fluid flows is formed inside the housing 32. The low-temperature fluid introduction member 34 and the low-temperature fluid discharge member 36 are arranged with a spacing therebetween in the front-rear direction and are in communication with the low-temperature fluid flow path 38 inside the housing 32. The low-temperature fluid flows into the low-temperature fluid flow path 38 inside the housing 32 through the low-temperature fluid introduction member 34 and is discharged to the outside through the low-temperature fluid discharge member 36 after flowing through the low-temperature fluid flow path 38.

As illustrated in FIGS. 1 and 2, the pair of side restriction members 8 and 10 are arranged to face each other with a spacing therebetween in the left-right direction (Y-axis direction). In more detail, the pair of side restriction members 8 and 10 are arranged to cover the high-temperature fluid flow path section 12 (described later) arranged between the pair of low-temperature fluid flow path sections 4 and 6 from sides in the left-right direction. The pair of side restriction members 8 and 10 are each formed in a rectangular flat plate shape.

As illustrated in FIGS. 2 and 3, the high-temperature fluid flow path section 12 is arranged between the pair of low-temperature fluid flow path sections 4 and 6. More specifically, the high-temperature fluid flow path section 12 is defined by a space surrounded by the pair of low-temperature fluid flow path sections 4 and 6 and the pair of side restriction members 8 and 10. The high-temperature fluid flow path section 12 functions as a high-temperature fluid flow path through which the high-temperature fluid (an example of the second fluid) flows. The high-temperature fluid is a fluid at higher temperature than the low-temperature fluid and is, for example, the exhaust gas discharged from the on-vehicle engine.

The high-temperature fluid introduction member 14 and the high-temperature fluid discharge member 16 are arranged to face each other with a spacing therebetween in the front-rear direction. In more detail, the high-temperature fluid introduction member 14 and the high-temperature fluid discharge member 16 are arranged to cover the high-temperature fluid flow path section 12 arranged between the pair of low-temperature fluid flow path sections 4 and 6 from sides in the front-rear direction. The high-temperature fluid introduction member 14 and the high-temperature fluid discharge member 16 are formed in a tubular shape and are in communication with the high-temperature fluid flow path section 12. The high-temperature fluid flows into the high-temperature fluid flow path section 12 through the high-temperature fluid introduction member 14 and is discharged to the outside through the high-temperature fluid discharge member 16 after flowing through the high-temperature fluid flow path section 12 in the front-rear direction (from a minus side toward a plus side of an X axis).

As illustrated in FIGS. 2 and 3, the pair of thermoelectric modules 18 and 20 are each arranged between the high-temperature fluid flow path section 12 and one of the pair of low-temperature fluid flow path sections 4 and 6 in a one-to-one relation. Thus, the pair of thermoelectric modules 18 and 20 are arranged to face each other with a spacing therebetween in the up-down direction.

The thermoelectric module 18 on an upper side is formed in a rectangular flat plate shape and is fixed to a lower surface (a surface on a side closer to the high-temperature fluid flow path section 12) of the housing 24 of the low-temperature fluid flow path section 4 on the upper side. In other words, the thermoelectric module 18 on the upper side is arranged such that it is sandwiched between the high-temperature fluid flow path section 12 and the low-temperature fluid flow path section 4 on the upper side from below and above, respectively. The thermoelectric module 18 on the upper side includes a thermoelectric generator that converts thermal energy, given as a temperature difference between the high-temperature fluid flowing through the high-temperature fluid flow path section 12 and the low-temperature fluid flowing through the low-temperature fluid flow path section 4 on the upper side, to electrical energy based on the Seebeck effect.

The thermoelectric module 20 on a lower side is formed in a rectangular flat plate shape and is fixed to an upper surface (a surface on a side closer to the high-temperature fluid flow path section 12) of the housing 32 of the low-temperature fluid flow path section on the lower side. In other words, the thermoelectric module 20 on the lower side is arranged such that it is sandwiched between the high-temperature fluid flow path section and the low-temperature fluid flow path section 6 on the lower side from above and below, respectively. The thermoelectric module 20 on the lower side includes a thermoelectric generator that converts thermal energy, given as a temperature difference between the high-temperature fluid flowing through the high-temperature fluid flow path section 12 and the low-temperature fluid flowing through the low-temperature fluid flow path section 6 on the lower side, to electrical energy based on the Seebeck effect.

An example of each of the thermoelectric module 18 and the thermoelectric module 20 may be a TEG module 102 disclosed in U.S. Patent Application Publication No. 2013/0340801. U.S. Patent Application Publication No. 2013/0340801 indicates that the TEG module 102 includes p-type thermoelectric material legs 105A and n-type thermoelectric material legs 105B.

The thermoelectric generator has, for example, a π-structure. In the thermoelectric generator of the π-structure, a p-type thermoelectric material and an n-type thermoelectric material are electrically connected in series through an electrode mounted on a ceramic substrate. One end of each of the thermoelectric materials is arranged on a high temperature side, and the other end is arranged on a low temperature side. Thus, a temperature difference is produced between both the ends of each thermoelectric material and a voltage difference is generated between both ends of the thermoelectric generator, whereby electricity is generated.

As illustrated in FIGS. 2 and 3, the fin structure 22 is arranged in the high-temperature fluid flow path section 12. The fin structure 22 has a role of transferring heat of the high-temperature fluid flowing through the high-temperature fluid flow path section 12 to each of the pair of thermoelectric modules 18 and 20. A configuration of the fin structure 22 will be described in detail below.

1-2. Configuration of Fin Structure

Figure 4:
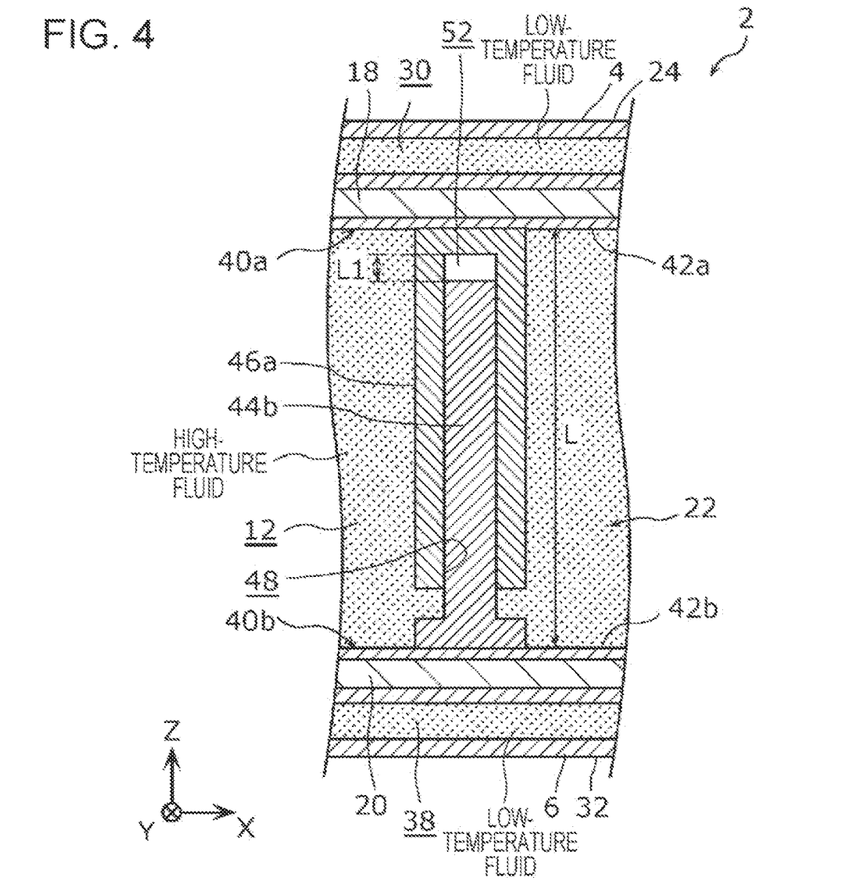
FIG. 4 is a sectional view of principal part of a fin structure according to Embodiment 1.
Figure 5:
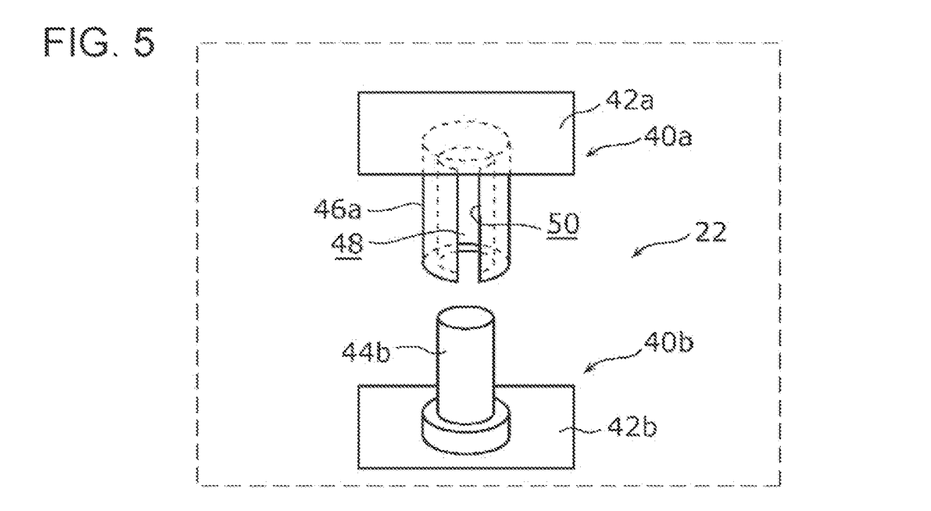
FIG. 5 is an exploded perspective view of the principal part of the fin structure according to Embodiment 1.

The configuration of the fin structure 22 is described with reference to FIGS. 2 to 5. FIG. 4 is a sectional view of principal part of the fin structure 22 according to Embodiment 1. FIG. 5 is an exploded perspective view of the principal part of the fin structure 22 according to Embodiment 1.

As illustrated in FIGS. 2 and 3, the fin structure 22 includes an upper fin 40a and a lower fin 40b.

The upper fin 40a includes a fixed plate 42a, convex fins 44a, and concave fins 46a, those convex and concave fins being connected to the fixed plate 42a. The fixed plate 42a, the convex fins 44a, and the concave fins 46a are integrally formed. The fixed plate 42a is formed as a thin rectangular plate and is fixed to a lower surface (a surface on a side closer to the high-temperature fluid flow path section 12) of the thermoelectric module 18 on the upper side. The convex fins 44a and the concave fins 46a are arranged on a lower surface of the fixed plate 42a in a lattice pattern, for example, and project in the form of a rod (pin) from the lower surface of the fixed plate 42a toward the thermoelectric module on the lower side. In other words, the convex fins 44a and the concave fins 46a are connected to the thermoelectric module 18 on the upper side in a heat-transferable manner through the fixed plate 42a.

Instead of the above-described configuration, the fixed plate 42a may be omitted, and the convex fins 44a and the concave fins 46a may be connected directly to the lower surface of the thermoelectric module 18 on the upper side in a heat-transferable manner. Thus, in this Description, the wording "connected in a heat-transferable manner" indicates not only the case in which two members are connected to each other through one or more members with a heat transfer property, but also the case in which two members are connected in direct contact with each other to be heat transferable therebetween. Instead of the above-described configuration, the upper fin 40a may include only ones of the convex fins 44a and the concave fins 46a.

The lower fin 40b includes a fixed plate 42b, convex fins 44b, and concave fins 46b, those convex and concave fins being connected to the fixed plate 42b. The fixed plate 42b, the convex fins 44b, and the concave fins 46b are integrally formed. The fixed plate 42b is formed as a thin rectangular plate and is fixed to an upper surface (a surface on a side closer to the high-temperature fluid flow path section 12) of the thermoelectric module on the lower side. The convex fins 44b and the concave fins 46b are arranged on an upper surface of the fixed plate 42b in a lattice pattern, for example, and project in the form of a rod (pin) from the upper surface of the fixed plate 42b toward the thermoelectric module 18 on the upper side. In other words, the convex fins 44b and the concave fins 46b are connected to the thermoelectric module 20 on the lower side in a heat-transferable manner through the fixed plate 42b.

Instead of the above-described configuration, the fixed plate 42b may be omitted, and the convex fins 44b and the concave fins 4ba may be connected directly to the upper surface of the thermoelectric module 20 on the lower side in a heat-transferable manner. When the upper fin 40a includes only ones of the convex fins 44a and the concave fins 46a instead of the above-described configuration, the lower fin 40b may include only the other ones of the convex fins 44b and the concave fins 46b.

The convex fins 44a of the upper fin 40a are arranged corresponding to the concave fins 46b of the lower fin 40b in a one-to-one relation and are fitted to the concave fins 46b of the lower fin 40b. The concave fins 46a of the upper fin 40a are arranged corresponding to the convex fins 44b of the lower fin 40b in a one-to-one relation and are fitted to the convex fins 44b of the lower fin 40b.

An interior and a surface of each of the upper fin 40a and the lower fin 40b are made of different materials. The interior of each of the upper fin 40a and the lower fin 40b is made of a material with high thermal conductivity, such as copper, a copper alloy, aluminum, an aluminum alloy, stainless, or ceramic. The surface of each of the upper fin 40a and the lower fin 40b is coated with a metal with high corrosion resistance, such as nickel, a nickel alloy, chromium, or a chromium alloy. For example, electrolytic plating, non-electrolytic plating, or thermal spraying can be used to coat the surface of each of the upper fin 40a and the lower fin 40b.

A fitting structure between the concave fin 46a of the upper fin 40a and the convex fin 44b of the lower fin 40b will be described below with reference to FIGS. 4 and 5. A fitting structure between the convex fin 44a of the upper fin 40a and the concave fin 46b of the lower fin 40b is similar to the fitting structure between the concave fin 46a of the upper fin 40a and the convex fin 44b of the lower fin 40b, and therefore description of the former fitting structure is omitted.

As illustrated in FIGS. 4 and 5, the convex fin 44b is formed in a circular cylindrical shape extending in the up-down direction. A root portion (a portion connected to the fixed plate 42b) of the convex fin 44b is enlarged in a radial direction into a flange shape.

As illustrated in FIGS. 4 and 5, the concave fin 46a is formed in a bottom-equipped circular cylindrical shape extending in the up-down direction. The concave fin 46a includes a recess 48 that is circular in cross-section and that extends from a tip to the vicinity of a root (an end connected to the fixed plate 42a) of the concave fin 46a along an axial direction (Z-axis direction) of the concave fin 46a. A diameter of the recess 48 is slightly greater than that of the convex fin 44b. As illustrated in FIG. 5, a cutout 50 extending from the tip to the root of the concave fin 46a along the axial direction of the concave fin 46a is formed in a peripheral wall of the concave fin 46a. The cutout 50 is formed in a slit shape and is in communication with the recess 48.

As illustrated in FIG. 4, the convex fin 44b is fitted to the recess 48 of the concave fin 46a. An outer peripheral surface of the convex fin 44b is in contact with an inner peripheral surface of the recess 48 of the concave fin 46a. Although not illustrated, a heat transfer material is interposed between the outer peripheral surface of the convex fin 44b and the inner peripheral surface of the recess 48 of the concave fin 46a. The heat transfer material is to increase a sliding (slipping) ability between the convex fin 44b and the concave fin 46a and to transfer heat between the convex fin 44b and the concave fin 46a. The heat transfer material is made of, for example, heat-resistant grease containing BN (boron nitride).

As illustrated in FIG. 4, a gap 52 is formed between the tip of the convex fin 44b and a bottom of the recess 48 of the concave fin 46a. When an entire length L of the convex fin 44b and the concave fin 46a in a mutually fitted state is 50 mm, for example, a width L1 of the gap 52 is greater than or equal to 50 μm and smaller than or equal to 100 μm. The width L1 of the gap 52 may be greater than or equal to 0.1% and smaller than or equal to 10% of the entire length L of the convex fin 44b and the concave fin 46a. If the width L1 is smaller than 0.1% of the entire length L, the thermal expansion or contraction (described later) of the convex fin 44b and the concave fin 46a in the axial direction cannot be sufficiently absorbed. If the width L1 exceeds 10% of the entire length L, a contact area between the outer peripheral surface of the convex fin 44b and the inner peripheral surface of the recess 48 of the concave fin 46a cannot be sufficiently ensured, and the efficiency of heat transfer between the convex fin 44b and the concave fin 46a is reduced.

1-3. Operation of Thermoelectric Conversion Unit

Operation of the thermoelectric conversion unit 2 according to Embodiment 1 will be described below with reference to FIGS. 1 and 3.

As illustrated in FIGS. 1 and 3, the low-temperature fluid flows into the low-temperature fluid flow path 30 inside the housing 24 of the low-temperature fluid flow path section 4 on the upper side through the low-temperature fluid introduction member 26 and, after flowing through the low-temperature fluid flow path 30, it is discharged to the outside through the low-temperature fluid discharge member 28. Heat of the low-temperature fluid flowing through the low-temperature fluid flow path section 4 on the upper side is transferred to an upper surface (a surface on a side closer to the low-temperature fluid flow path section 4) of the thermoelectric module 18 on the upper side, whereby the upper surface of the thermoelectric module 18 on the upper side is cooled.

The low-temperature fluid flows into the low-temperature fluid flow path 38 inside the housing 32 of the low-temperature fluid flow path section 6 on the lower side through the low-temperature fluid introduction member 34 and, after flowing through the low-temperature fluid flow path 38, it is discharged to the outside through the low-temperature fluid discharge member 36. Heat of the low-temperature fluid flowing through the low-temperature fluid flow path section 6 on the lower side is transferred to a lower surface (a surface on a side closer to the low-temperature fluid flow path section 6) of the thermoelectric module 20 on the lower side, whereby the lower surface of the thermoelectric module 20 on the lower side is cooled.

As illustrated in FIGS. 1 and 3, the high-temperature fluid flows into the high-temperature fluid flow path section 12 through the high-temperature fluid introduction member 14 and, after flowing through the high-temperature fluid flow path section 12 in the front-rear direction, it is discharged to the outside through the high-temperature fluid discharge member 16. The heat of the high-temperature fluid flowing through the high-temperature fluid flow path section 12 is transferred to the lower surface of the thermoelectric module 18 on the upper side through the upper fin 40a and the lower fin 40b. More specifically, the heat of the high-temperature fluid flowing through the high-temperature fluid flow path section 12 is transferred to the lower surface of the thermoelectric module 18 on the upper side not only through the convex fins 44a of the upper fin 40a, the concave fins 46b of the lower fin 40b, and the fixed plate 42a, those convex and concave fins being fitted to each other, but also through the concave fins 46a of the upper fin 40a, the convex fins 44b of the lower fin 40b, and the fixed plate 42b, those convex and concave fins being fitted to each other. On that occasion, the heat of the high-temperature fluid is transferred between the convex fins 44a and the concave fin 46b fitted to each other and between the concave fin 46a and the convex fin 44b fitted to each other. Accordingly, the lower surface of the thermoelectric module 18 on the upper side is heated.

The heat of the high-temperature fluid flowing through the high-temperature fluid flow path section 12 is transferred to the upper surface of the thermoelectric module 20 on the lower side through the upper fin 40a and the lower fin 40b. More specifically, the heat of the high-temperature fluid flowing through the high-temperature fluid flow path section is transferred to the upper surface of the thermoelectric module 20 on the lower side not only through the convex fins 44a of the upper fin 40a, the concave fins 46b of the lower fin 40b, and the fixed plate 42b, those convex and concave fins being fitted to each other, but also through the concave fins 46a of the upper fin 40a, the convex fins 44b of the lower fin 40b, and the fixed plate 42b, those convex and concave fins being fitted to each other. On that occasion, the heat of the high-temperature fluid is transferred between the convex fins 44a and the concave fin 46b fitted to each other and between the concave fin 46a and the convex fin 44b fitted to each other. Accordingly, the upper surface of the thermoelectric module 20 on the lower side is heated.

In such a manner, a temperature difference (temperature gradient) is given to the thermoelectric module 18 on the upper side in its thickness direction (Z-axis direction) such that a lower surface side is held at high temperature and an upper surface side is held at low temperature. Therefore, the thermoelectric module 18 on the upper side generates electricity based on the temperature difference between the lower surface side and the upper surface side (i.e., the temperature difference between the high-temperature fluid and the low-temperature fluid).

A temperature difference (temperature gradient) is given to the thermoelectric module 20 on the lower side in its thickness direction (Z-axis direction) such that an upper surface side is held at high temperature and a lower surface side is held at low temperature. Therefore, the thermoelectric module 20 on the lower side generates electricity based on the temperature difference between the upper surface side and the lower surface side (i.e., the temperature difference between the high-temperature fluid and the low-temperature fluid).

1-4. Advantageous Effects

According to this embodiment, since the fin structure 22 is disposed in the high-temperature fluid flow path section 12, the heat of the high-temperature fluid flowing through the high-temperature fluid flow path section 12 can be efficiently transferred to each of the pair of thermoelectric modules 18 and 20 through the fin structure 22. As a result, the temperature difference given to each of the pair of thermoelectric modules 18 and 20 can be increased, whereby the power generation capacity and the thermoelectric conversion efficiency in each of the pair of thermoelectric modules 18 and 20 can be increased.

According to this embodiment, the fin structure 22 has the fitting structure between the convex fin 44b and the concave fin 46a. Therefore, even when the convex fin 44b and the concave fin 46a fitted to each other are thermally expanded or contracted due to change in temperature of the high-temperature fluid flowing through the high-temperature fluid flow path section 12, the outer peripheral surface of the convex fin 44b and the inner peripheral surface of the recess 48 of the concave fin 46a are allowed to slide relatively in the axial direction (Z-axis direction). On that occasion, the thermal expansion or contraction of the convex fin 44b and the concave fin 46a in the axial direction is absorbed by the gap 52 formed between the tip of the convex fin 44b and the bottom of the recess 48 of the concave fin 46a.

As a result, it is possible to absorb stress applied to each of the pair of thermoelectric modules 18 and 20 and to suppress deformations of the pair of thermoelectric modules 18 and 20, the deformations being caused by change in temperature of the high-temperature fluid.

The width L1 of the gap 52 may be set to be as small as possible to maximize the overall heat transfer coefficient of the fin structure 22 and to maximize the power generation capacity in each of the pair of thermoelectric modules 18 and 20. When temperature change of about 400° C. occurs on the convex fin 44a and the concave fin 46b with the linear thermal expansion coefficient of about $10^{-5}$ (1/K) and the entire length L1 of about 50 mm, for example, thermal expansion of about 20 μm is caused. Accordingly, reduction of the stress and improvement in the efficiency of heat transfer can be both realized by setting the width L1 of the gap 52 to be greater than or equal to about 50 μm and smaller than or equal to about 100 μm.

As the entire length L of the convex fin 44b and the concave fin 46a in the mutually fitted state increases, the contact area between those fins and the high-temperature fluid increases. Thus, the power generation capacity and the thermoelectric conversion efficiency in each of the pair of thermoelectric modules 18 and 20 can be further increased.

Since the cutout 50 is formed in the concave fin 46a, the concave fin 46a is deformable in the radial direction. Accordingly, the thermal expansion or contraction of the convex fin 44b and the concave fin 46a in the radial direction can be absorbed.

Advantageous effects obtained with the fitting structure between the convex fin 44a and the concave fin 46b are similar to the above-described ones obtained with the fitting structure between the convex fin 44b and the concave fin 46a, and therefore description of the former advantageous effects is omitted.

1-5. Modification 1

Figure 6:
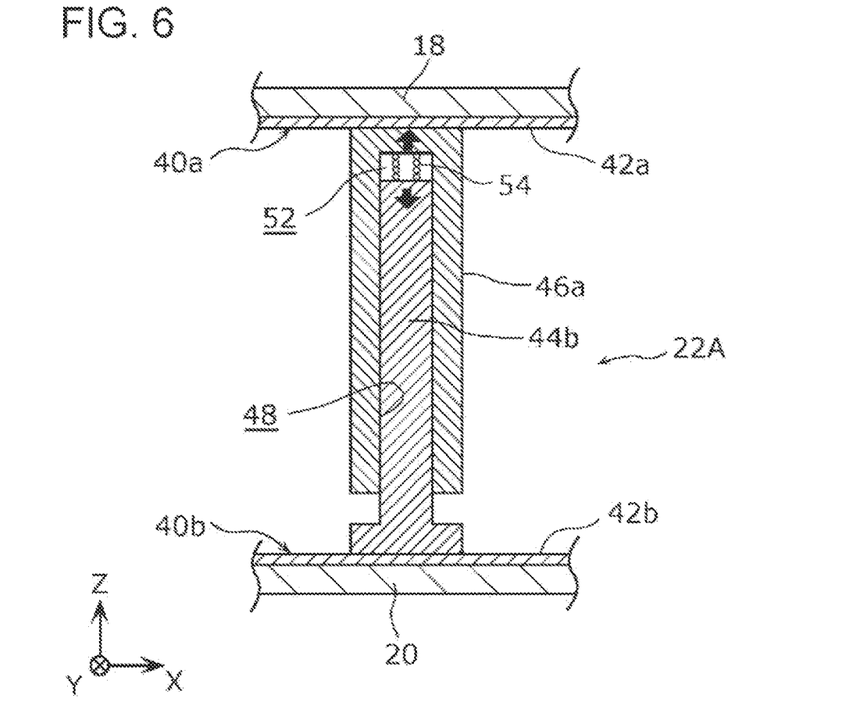
FIG. 6 is a sectional view of principal part of a fin structure according to Modification 1 of Embodiment 1.

A configuration of a fin structure 22A according to Modification 1 of Embodiment 1 will be described below with reference to FIG. 6. FIG. 6 is a sectional view of principal part of the fin structure 22A according to Modification 1 of Embodiment 1.

As illustrated in FIG. 6, in the fin structure 22A according to Modification 1, a biasing member 54 is disposed in the gap 52. The biasing member 54 is, for example, a coil spring. The biasing member 54 is made of, for example, Inconel (registered trademark) that has heat resistance and resiliency until reaching 350° C. The biasing member 54 biases the concave fin 46a toward the thermoelectric module 18 on the upper side and further biases the convex fin 44b toward the thermoelectric module 20 on the lower side.

Thus, the concave fin 46a and the convex fin 44b can be pressed against the thermoelectric module 18 on the upper side and the thermoelectric module 20 on the lower side, respectively. As a result, the thermoelectric module 18 on the upper side and the upper fin 40a can be reliably held in contact with each other in a heat-transferable manner, and the thermoelectric module 20 on the lower side and the lower fin 40b can be reliably held in contact with each other in a heat-transferable manner.

1-6. Modification 2

Figure 7:
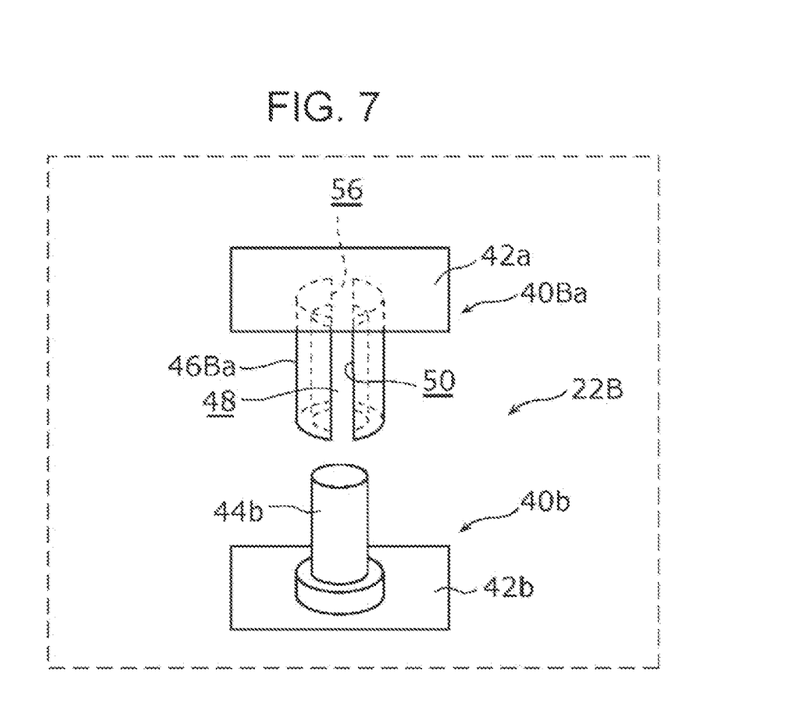
FIG. 7 is an exploded perspective view of principal part of a fin structure according to Modification 2 of Embodiment 1.

A configuration of a fin structure 22B according to Modification 2 of Embodiment will be described below with reference to FIG. 7. FIG. 7 is an exploded perspective view of principal part of the fin structure 22B according to Modification 2 of Embodiment 1.

As illustrated in FIG. 7, in the fin structure 22B according to Modification 2, a cutout 56 is formed in a concave fin 46Ba of an upper fin 40Ba in addition to the above-mentioned cutout 50. The cutout 56 is arranged at a position substantially symmetrical to the cutout 50 with respect to a center axis of the concave fin 46Ba. The cutout 56 extends from a tip to a root of the concave fin 46Ba along an axial direction of the concave fin 46Ba. The cutout 56 is formed in a slit shape and is in communication with the recess 48.

Thus, since the pair of cutouts 50 and 56 are formed in the concave fin 46Ba, the concave fin 46Ba is easier to deform in the radial direction. Accordingly, the thermal expansion or contraction of the convex fin 44b and the concave fin 46Ba in the radial direction can be more effectively absorbed.

1-7. Modification 3

Figure 8:
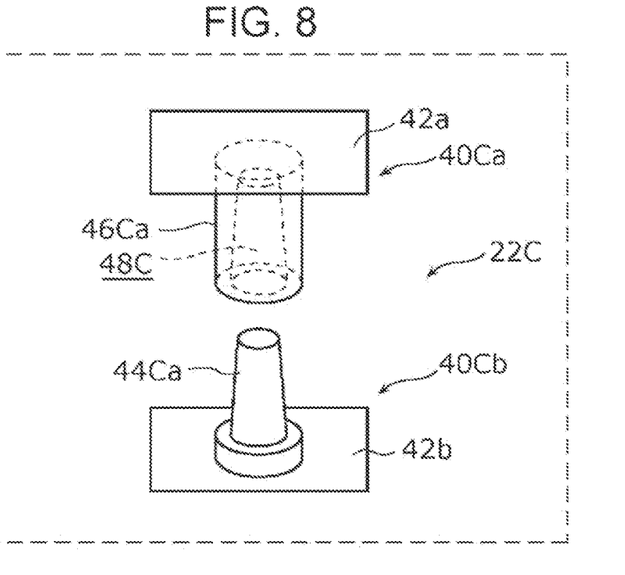
FIG. 8 is an exploded perspective view of principal part of a fin structure according to Modification 3 of Embodiment 1.

A configuration of a fin structure 22C according to Modification 3 of Embodiment will be described below with reference to FIG. 8. FIG. 8 is an exploded perspective view of principal part of the fin structure 22C according to Modification 3 of Embodiment 1.

As illustrated in FIG. 8, in the fin structure 22C according to Modification 3, an outer peripheral surface of a convex fin 44Ca of a lower fin 40Cb is formed in a tapered shape with a diameter gradually decreasing toward a tip from a root of the convex fin 44Ca. An inner peripheral surface of a recess 48C of a concave fin 46Ca of an upper fin 40Ca is formed in a tapered shape with a diameter gradually decreasing toward a bottom from an opening of the recess. The above-described cutout(s) is not formed in the concave fin 46Ca.

With such a configuration, the stress generated upon the thermal expansion or contraction can be released in the radial direction of the convex fin 44Ca and the concave fin 46Ca. Since weak brace stress remains in the axial direction of the convex fin 44Ca and the concave fin 46Ca, interface heat resistance can be kept low while contact between the thermoelectric module 18 on the upper side (see FIG. 4) and the upper fin 40Ca and contact between the thermoelectric module 20 on the lower side (see FIG. 4) and the lower fin 40Cb can be maintained. Thus, the heat transfer performance between the high-temperature fluid and each of the pair of thermoelectric modules 18 and 20 can be ensured.

While, in this modification, any cutout is not formed in the concave fin 46Ca, the present disclosure is not limited to that case, and one or more cutouts may be formed in the concave fin 46Ca.

Embodiment 2

Figure 9:
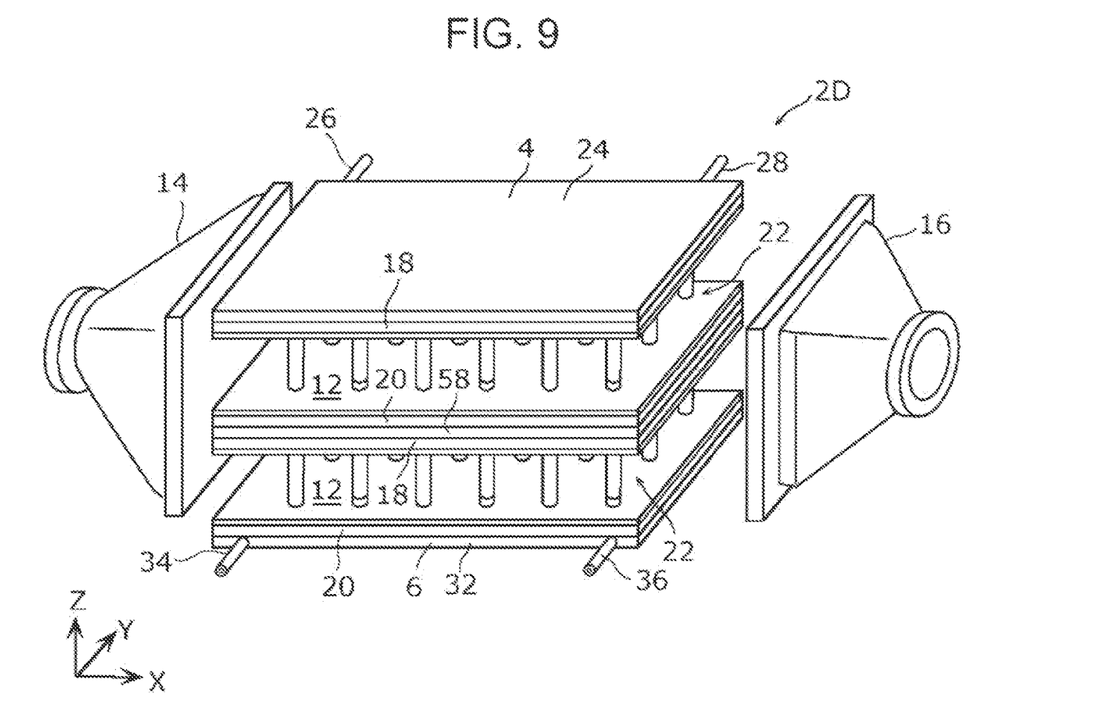
FIG. 9 is an exploded perspective view of a thermoelectric conversion unit according to Embodiment 2.

A configuration of a thermoelectric conversion unit 2D according to Embodiment will be described below with reference to FIG. 9. FIG. 9 is an exploded perspective view of the thermoelectric conversion unit 2D according to Embodiment 2. In this embodiment, the same constituent elements as those in the above-described Embodiment 1 are denoted by the same reference sings, and description of those constituent elements is omitted. For convenience of explanation, the pair of side restriction members 8 and 10 (see FIG. 2) described in the above-described Embodiment 1 are not illustrated in FIG. 9.

As illustrated in FIG. 9, in the thermoelectric conversion unit 2D according to Embodiment 2, two sets of units each including the pair of thermoelectric modules 18 and and the fin structure 22 between both the thermoelectric modules are stacked (arranged one above the other) in the up-down direction with a low-temperature fluid flow path section 58 at a center interposed between those two sets of units. The low-temperature fluid flow path section 58 has the same structure as the above-described pair of low-temperature fluid flow path sections 4 and 6. With the above-mentioned stack structure, the thermoelectric conversion unit 2D can be made compact.

While, in this embodiment, the two sets of units each including the pair of thermoelectric modules 18 and 20 and the fin structure 22 between both the thermoelectric modules are stacked in the up-down direction, the present disclosure is not limited to that case, and three or more sets may be stacked.

Other Embodiments

The thermoelectric conversion unit according to one or more aspects of the present disclosure has been described in connection with the embodiments, but the present disclosure is not limited to those embodiments. Various modifications conceivable by those skilled in the art from the above-described embodiments may also fall within the scope of the one or more aspects of the present disclosure insofar as not departing from the gist of the present disclosure.

While the above-described embodiments employ the exhaust gas as the high-temperature fluid and cold water or cold air as the low-temperature fluid, the present disclosure is not limited to that case, and each of the high-temperature fluid and the low-temperature fluid may be any suitable liquid or gas (gaseous medium).

The thermoelectric conversion unit according to the present disclosure can be used as, for example, a power generator generating electricity by utilizing thermal energy of exhaust gas discharged from an automobile, a factory, and so on, or as a small-sized portable power generator and so on.

What is claimed is:

1. A thermoelectric conversion unit generating electricity based on a temperature difference between a first fluid and a second fluid at higher temperature than the first fluid, the thermoelectric conversion unit comprising:
   a pair of first fluid flow path sections through each of which the first fluid flows, the pair of first fluid flow path sections being arranged to face each other;
   a second fluid flow path section through which the second fluid flows, the second fluid flow path section being arranged between the pair of first fluid flow path sections;
   a pair of thermoelectric modules each arranged between the second fluid flow path section and one of the pair of first fluid flow path sections in a one-to-one relation, the pair of thermoelectric modules converting thermal energy given by the temperature difference between the first fluid and the second fluid to electrical energy;
   a convex fin formed in a rod shape and arranged in the second fluid flow path section, the convex fin being connected to one of the pair of thermoelectric modules in a heat-transferable manner and projecting toward the other of the pair of thermoelectric modules; and
   a concave fin formed in a rod shape and arranged in the second fluid flow path section, the concave fin being connected to the other of the pair of thermoelectric modules in a heat-transferable manner and projecting toward the one of the pair of thermoelectric modules,
   wherein the concave fin includes a recess fitted to the convex fin, and
   wherein an outer peripheral surface of the convex fin and an inner peripheral surface of the recess of the concave fin are in contact with each other, and a gap is formed between a tip of the convex fin and a bottom of the recess of the concave fin.

2. The thermoelectric conversion unit according to claim 1,
   wherein a width of the gap is greater than or equal to 0.1% and smaller than or equal to 10% of an entire length of the convex fin and the concave fin in a mutually fitted state.

3. The thermoelectric conversion unit according to claim 1,
   wherein the outer peripheral surface of the convex fin and the inner peripheral surface of the recess of the concave fin are each formed in a tapered shape.

4. The thermoelectric conversion unit according to claim 1,
   wherein the concave fin includes a cutout extending along an axial direction of the concave fin.

5. The thermoelectric conversion unit according to claim 1,
   wherein a heat transfer material giving a sliding ability to between the convex fin and the concave fin and transferring heat between the convex fin and the concave fin is interposed between the outer peripheral surface of the convex fin and the inner peripheral surface of the recess of the concave fin.

6. The thermoelectric conversion unit according to claim 1,
   further comprising a biasing member arranged in the gap and biasing the convex fin and the concave fin respectively toward the one and the other of the pair of thermoelectric modules.

7. The thermoelectric conversion unit according to claim 1, wherein an interior and a surface of each of the convex fin and the concave fin are made of different materials.

8. The thermoelectric conversion unit according to claim 7,
wherein the interior of each of the convex fin and the concave fin is made of copper, a copper alloy, aluminum, an aluminum alloy, stainless, or ceramic.

9. The thermoelectric conversion unit according to claim 7,
wherein the surface of each of the convex fin and the concave fin is made of nickel, a nickel alloy, chromium, or a chromium alloy.

10. A thermoelectric conversion unit comprising:
a first flow path;
a second flow path:
a third flow path arranged between the first flow path and the second flow path;
a first device arranged between the first flow path and the third flow path, the first device converting thermal energy given by a difference between temperature of a first fluid flowing through the first flow path and temperature of a third fluid flowing through the third flow path to electrical energy;
a second device arranged between the second flow path and the third flow path, the second device converting thermal energy given by a difference between temperature of the second fluid flowing through the second flow path and the temperature of the third fluid to electrical energy;
a first fin including a first bottom surface and a projecting portion, the first fin being arranged in the third flow path; and
a second fin including a second bottom surface and a recessed portion fitted to the projecting portion, the second fin being arranged in the third flow path,
wherein the first bottom surface is fixed to the first device directly or through a first member,
the second bottom surface is fixed to the second device directly or through a second member,
a distance between the first fin and the first device is shorter than a distance between the first fin and the second device,
a distance between the second fin and the second device is shorter than a distance between the second fin and the first device, and
a distance between the second bottom surface and the projecting portion is longer than a distance between the second bottom surface and the recessed portion.

11. The thermoelectric conversion unit according to claim 10,
wherein the temperature of the third fluid is higher than the temperature of the first fluid and the temperature of the second fluid.

12. The thermoelectric conversion unit according to claim 10,
wherein the first member is in direct contact with the first device and the first bottom surface, and
the second member is in direct contact with the second device and the second bottom surface.

* * * * *